(12) United States Patent
Sarpatwari et al.

(10) Patent No.: US 11,417,381 B2
(45) Date of Patent: Aug. 16, 2022

(54) MEMORY DEVICE HAVING SHARED READ/WRITE ACCESS LINE FOR 2-TRANSISTOR VERTICAL MEMORY CELL

(71) Applicant: Micron Technology, Inc., Boise, ID (US)

(72) Inventors: Karthik Sarpatwari, Boise, ID (US); Kamal M. Karda, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 239 days.

(21) Appl. No.: 16/725,643

(22) Filed: Dec. 23, 2019

(65) Prior Publication Data

US 2020/0211615 A1 Jul. 2, 2020

Related U.S. Application Data

(60) Provisional application No. 62/785,136, filed on Dec. 26, 2018.

(51) Int. Cl.
*G11C 11/402* (2006.01)
*H01L 27/105* (2006.01)
(Continued)

(52) U.S. Cl.
CPC ........ *G11C 11/4023* (2013.01); *G11C 11/409* (2013.01); *H01L 27/1052* (2013.01); *H01L 29/22* (2013.01); *H01L 29/7827* (2013.01)

(58) Field of Classification Search
CPC combination set(s) only.
See application file for complete search history.

(56) References Cited

U.S. PATENT DOCUMENTS

| 6,396,745 | B1 | 5/2002 | Hong et al. | |
| 2009/0225604 | A1* | 9/2009 | Van Duuren | G11C 16/0475 257/314 |

(Continued)

FOREIGN PATENT DOCUMENTS

| CN | 113728432 | 11/2021 |
| KR | 20130109821 | 10/2013 |

(Continued)

OTHER PUBLICATIONS

"International Application Serial No. PCT US2019 068379, International Search Report dated Apr. 22, 2020", 4 pgs.

(Continued)

*Primary Examiner* — Julio J Maldonado
*Assistant Examiner* — Mohammad A Rahman
(74) *Attorney, Agent, or Firm* — Schwegman Lundberg & Woessner, P.A.

(57) ABSTRACT

Some embodiments include apparatuses and methods operating the apparatuses. One of the apparatuses includes a first data line located over a substrate, a second data line located over the first data line, a third data line located over the second data line and electrically separated from the first and second data lines, and a memory cell coupled to the first, second, and third data lines. The memory cell includes a first material between the first and second data lines and electrically coupled to the first and second data lines; a second material located over the first data line and the first material, the second material electrically separated from the first material and electrically coupled to the third data line; and a memory element electrically coupled to the second material and electrically separated from the first material and first and second data lines.

19 Claims, 13 Drawing Sheets

(51) Int. Cl.
*H01L 29/78* (2006.01)
*H01L 29/22* (2006.01)
*G11C 11/409* (2006.01)

(56) References Cited

U.S. PATENT DOCUMENTS

2017/0271338 A1  9/2017  Yamazaki et al.
2018/0061834 A1  3/2018  Derner et al.

FOREIGN PATENT DOCUMENTS

WO  2018182725  10/2018
WO  2020139846  7/2020

OTHER PUBLICATIONS

"International Application Serial No. PCT US2019 068379, Written Opinion dated Apr. 22, 2020", 5 pgs.
"International Application Serial No. PCT US2019 068379, International Preliminary Report on Patentability dated Jul. 8, 2021", 7 pgs.

* cited by examiner

MEMORY DEVICE HAVING SHARED READ/WRITE ACCESS LINE FOR 2-TRANSISTOR VERTICAL MEMORY CELL

PRIORITY APPLICATION

This application claims the benefit of priority to U.S. Provisional Application Ser. No. 62/785,136, filed Dec. 26, 2018, which is incorporated herein by reference in its entirety.

BACKGROUND

Memory devices are widely used in computers and many other electronic items to store information. Memory devices are generally categorized into two types: volatile memory device and non-volatile memory device. An example of a volatile memory device includes a dynamic random-access memory (DRAM) device. An example of a non-volatile memory device includes a flash memory device (e.g., a flash memory stick). A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T memory cell). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. Other improvements and benefits of the described memory device and its variation is discussed below with reference to FIG. 1 through FIG. 10.

Figure 1:
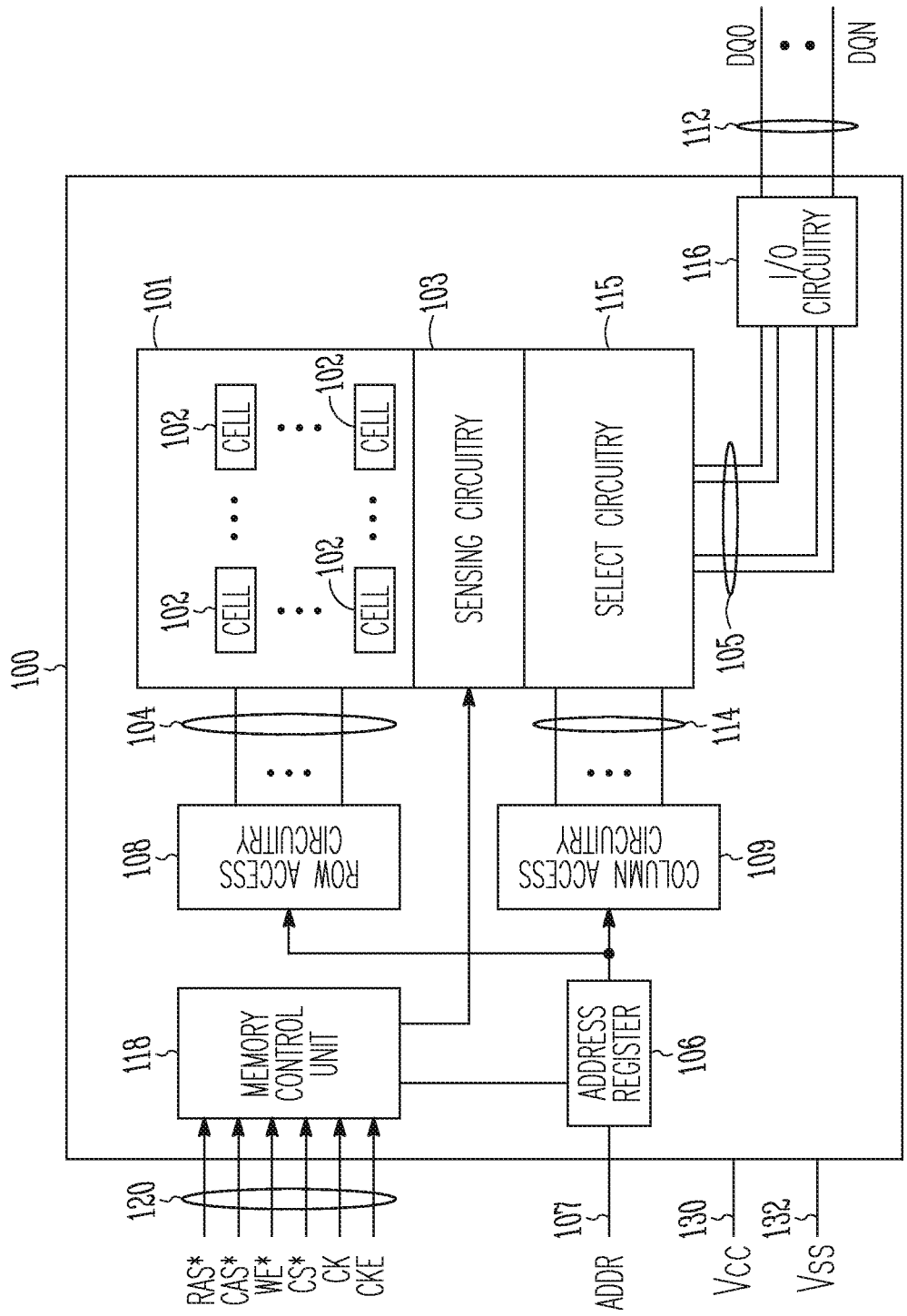
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is volatile memory device (e.g., a DRAM device), such that memory cells 102 are volatile memory cells. Thus, information stored in memory cells 102 may be lost (e.g., invalid) if supply power (e.g., supply voltage Vcc) is disconnected from memory device 100. Hereinafter, Vcc is referred to as representing some voltage levels, however, they are not limited to a supply voltage (e.g., Vcc) of the memory device (e.g., memory device 100). For example, if the memory device (e.g., memory device 100) has an internal voltage generator (not shown in FIG. 1) that generates an internal voltage based on Vcc, such an internal voltage may be used instead of Vcc.

In a physical structure of memory device 100, each of memory cells 102 can include transistors (e.g., two transistors) formed vertically (e.g., stacked over each other in different layers) in different levels over a substrate (e.g., semiconductor substrate) of memory device 100. The structure of memory array 101, including memory cells 102, can include the structure of memory arrays 101 and memory cells 102 described below with reference to FIG. 2 through FIG. 10.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts).

Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components), to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form signals DQ0 through DQN) can be based on the values of the signals on data lines 105. In a write operation, the value (e.g., "0" or "1") of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines 114 (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 10.

Figure 2:
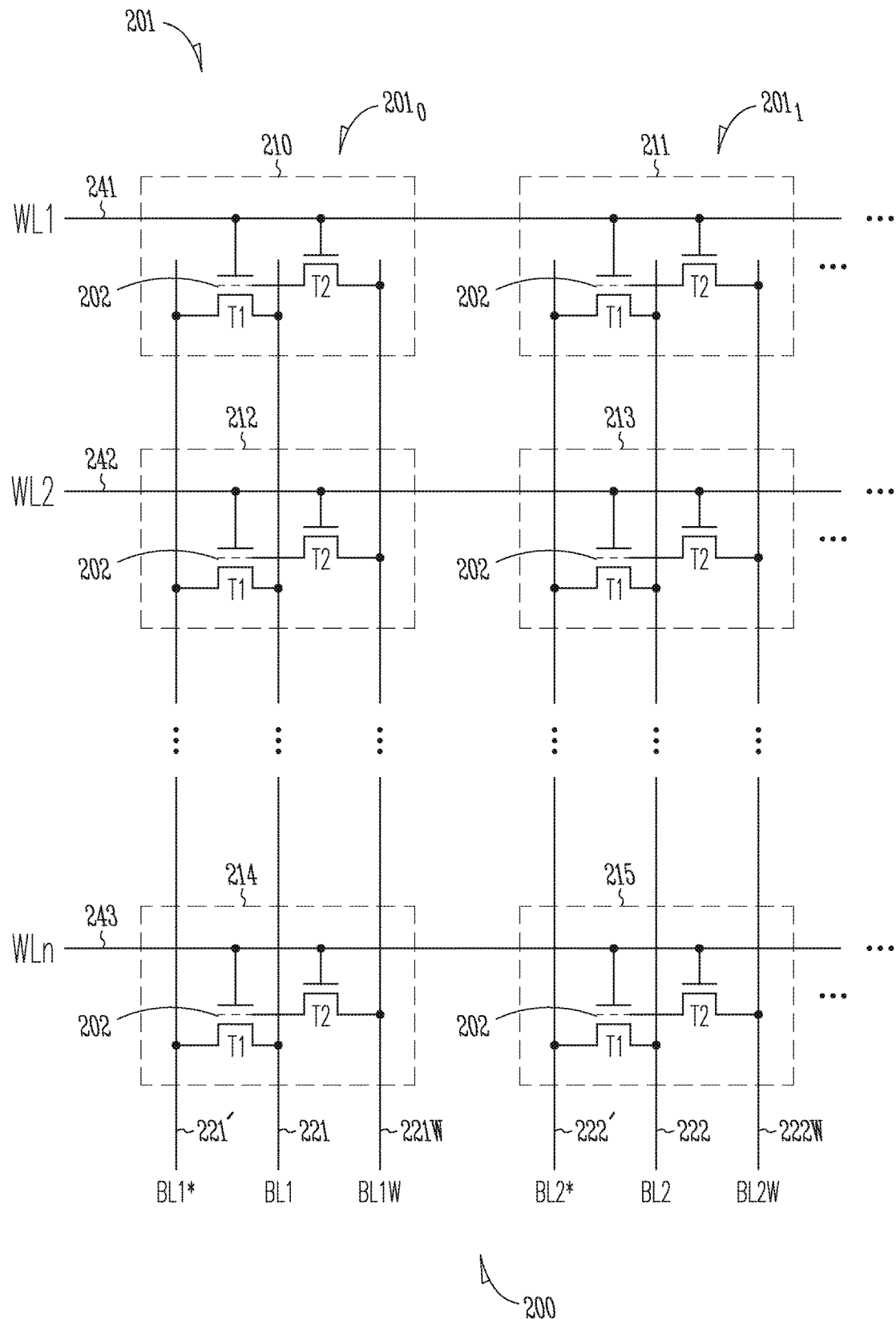
FIG. 2 shows a schematic diagram of a portion of a memory device including a memory array of 2-transistor (2T) memory cells, according to some embodiments described herein.

FIG. 2 shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Each of memory cells 210 through 215 can include two transistors T1 and T2. Thus, each of memory cells 210 through 215 can be called a 2T memory cell (e.g. 2T gain cell). Each of transistors T1 and T2 can include a field-effect transistor (FET). Transistor T1 can include a charge-storage based structure (e.g., a floating-gate based). As shown in FIG. 2, each of memory cells 210 through 215 can include a charge storage structure 202, which can include the floating gate (e.g., floating gate 202) of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$, as an example. The number of memory cells in memory cell groups $201_0$ and $201_1$ can be different from three.

Memory device 200 can perform a write operation to store information in memory cells 210 through 215, and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate (e.g., floating gate 202) of transistor T1. Thus, memory device 200 can be called a floating-gate based DRAM device.

As shown in FIG. 2, memory device 200 can include access lines (e.g., word lines) 241, 242, and 243 that can carry respective signals (e.g., word line signals) WL1, WL2, and WL3. Access lines 241, 242, and 243 can be used to access both memory cell groups $201_0$ and $201_1$. Each of access lines 241, 242, and 243 can be structured as at least one conductive line (one conductive or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored information in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Two separate access lines can be used to control respective transistors T1 and T2 during an access to a respective memory cell during read and write operations. However, using a single access line (e.g., shared access line) in memory device 200 to control both transistors T1 and T2 of a respective memory cell can save space and simplify operation of memory device 200.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241.

The gate of each of transistors T1 and T2 of memory cell 212 can be part of access line 242. The gate of each of transistors T1 and T2 of memory cells 213 can be part of access line 242.

The gate of each of transistors T1 and T2 of memory cell 214 can be part of access line 243. The gate of each of transistors T1 and T2 of memory cell 215 can be part of access line 243.

Memory device 200 can include data lines (e.g., read bit lines) 221, 221', 221W, 222, 222', and 222W that can carry respective signals (e.g., read bit line signals) BL1, BL1*, BL2, and BL2*, and data lines (e.g., write bit lines) 221W and 222W that can carry respective signals (e.g., write bit line signals) BL1W and BL2W. During a read operation, memory device 200 can use data lines 221 and 221' to obtain information read (e.g., sense) from a selected memory cell of memory cell group $201_0$, and data lines 222 and 222' to read information from a selected memory cell of memory cell group $201_1$. During a write operation, memory device 200 can use data line 221W to provide information to be stored in a selected memory cell of memory cell group $201_0$, and data line 222W to provide information to be stored in a selected memory cell of memory cell group $201_1$.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., 210, 212, or 214) can include a current path (e.g., read current path) through a channel region of transistor T1 of that particular memory cell and data lines 221 and 221'. In memory cell group $201_1$, a read path of a particular memory cell (e.g., 221, 213, or 215) can include a current path (e.g., read current path) through a channel region of transistor T1 of that particular memory cell and data lines 222 and 222'. Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include a current path (e.g., write current path) through a channel region of transistor T2 of that particular memory cell and data line 221W. In memory cell group $201_1$, a write path of a particular memory cell (e.g., 221, 213, or 215) can include a current path (e.g., a write current path) through a channel region of transistor T2 of that particular memory cell and data line 222W. Since transistor T2 can be used in a write path to store information in a respective memory cell during a write operation, tran-sistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt 1 and Vt2 allows reading (e.g., sensing) of information stored in charge storage structure 202 in transistor T1 on the read path without affecting (e.g., without turning on) transistor T2 on the write path (e.g., path through transistor T2). This can prevent leaking of charge from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows, Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1", where Vt1 for state "0"<0V (or alternatively Vt 1 for state "0"=0V), Vt1 for state "1">0V, and Vt1<Vt2.

In another alternative structure, transistors T1 and T2 can be formed (e.g., engineered) such that Vt1 (for state "0") <Vt1 (for state "1"), where Vt1 for state "0"=0V (or alternatively Vt1 for state "0">0V, and Vt1<Vt2).

During read operation of memory device 200, only one memory cell of the same memory cell group can be selected one at a time to read information from the selected memory cell. For example, memory cells 210, 212, and 214 of memory cell groups $201_0$ can be selected one at a time during a read operation to read information from the selected memory cell (e.g., one of memory cells 210, 212, and 214 in this example). In another example, memory cells 212, 213, and 215 of memory cell groups $201_1$ can be selected one at a time during a read operation to read information from the selected memory cell (e.g., one of memory cells 212, 213, and 215 in this example).

During a read operation, memory cells of different memory cell groups (e.g., memory cell groups 2010 and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g., sensed) from a read path (described above) that includes transistor T1 of the selected memory cell (e.g., memory cell 210, 212, or 214) and data lines 221 and 221'. The value of information read from the selected memory cell of memory cell group $201_1$ during a read operation can be determined based on the value of a current detected (e.g., sensed) from a read path that includes transistor T1 of the selected memory cell (e.g., memory cell 211, 213, or 215) and data lines 222 and 222'.

Memory device 200 can include detection circuitry (not shown) that can operate during a read operation to detect (e.g., sense) a current (e.g., current I1, not shown) on a read path that includes data lines 221 and 221', and detect a current (e.g., current I2, not shown) on a read path that includes data lines 222 and 222'. The value of the detected current can be based on the value of information stored in the selected memory cell. For example, depending on the value of information stored in the selected memory cell of memory cell group $201_0$, the value of the detected current (e.g., the value of current I1) between data lines 221 and 221' can be zero or greater than zero. Similarly, depending on the value of information stored in the selected memory cell of memory cell group $201_1$, the value of the detected current (e.g., the value of current I2) between data lines 222 and 222' can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected one at a time to store information in the selected memory cell. For example, memory cell 210, 212, and 214 of memory cell groups $201_0$ can be selected one at a time during a write operation to store information in the selected memory cell (e.g., one of memory cell 210, 212, and 214 in this example). In another example, memory cells 212, 213, and 215 of memory cell groups $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path that includes data line 221W and transistor T2 of the selected memory cell (e.g., memory cell 210, 212, or 214). Information to be stored in a selected memory cell of memory cell group $201_1$ during a write operation can be provided through a write path that includes data line 222W and transistor T2 of the selected memory cell (e.g., memory cell 212, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221W or 222W) coupled to that particular memory cell. For example, a voltage having one value (e.g., 0V) can be applied on data line 221W (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
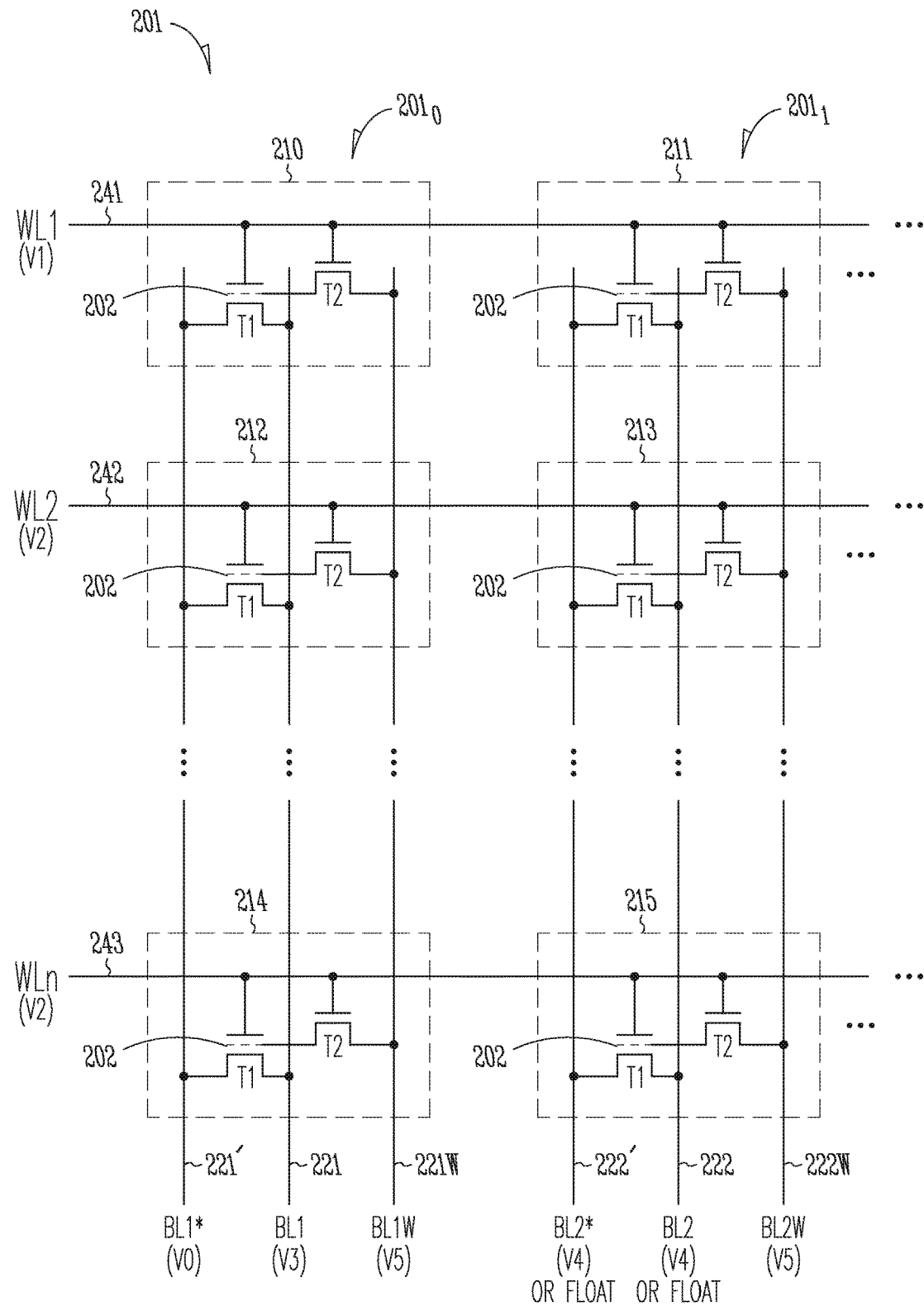
FIG. 3 shows the memory device of FIG. 2, including example voltages used during a read operation of the memory device, according to some embodiments described herein.

FIG. 3 shows memory device 200 of FIG. 2 including example voltages V0, V1, V2, and V3 used during a read operation of memory device 200, according to some embodiments described herein. The example of FIG. 3 assumes that memory cell 210 is a selected memory cell (e.g., target memory cell) during a read operation to read (e.g., to sense) information stored (e.g., previously stored) in memory cell 210. Memory cells 212 through 215 are assumed to be unselected memory cells. This means that memory cells 212 through 215 are not accessed and information stored in memory cells 212 through 215 are not read while information is read from memory cell 210 in the example of FIG. 3.

In FIG. 3, voltages V0, V1, V2, V3, V4, and V5 can represent different voltages applied to respective access lines 241, 242, and 243, and data lines 221, 221', 221W, 222, 222', and 222W during a read operation of memory device 200. As an example, voltages V0, V1, V2, V3, V4, and V5 can have values of 0V (e.g., ground), 0.5V, 0V, 0.5V, 0V, and 2V, respectively. These values are example values. Different values may be used.

As shown in FIG. 3, each of data lines 222 and 222' can be either applied with voltage V4 or placed in a "FLOAT" condition. Placing a particular conductive line (e.g., data line 222 or 222') in a FLOAT condition during a particular operation can include allowing the potential on that particular conductive line to vary or to "float" (e.g., by not coupling that particular conductive line to a fixed potential (e.g., ground or other voltages). In the example read operation of FIG. 3, each of data lines 222 and 222' in FIG. 3 can be placed in a FLOAT condition by, for example, decoupling each of data lines 222 and 222' from ground or from a fixed positive voltage source. This allows the potential on each of data lines 222 and 222' to vary (e.g., to "float") during the operation of reading information from memory cell 210 (selected memory cell in this example).

In the read operation shown in FIG. 3, voltage V1 can have a value (voltage value) to turn on transistor T1 of memory cell 210 (a selected memory cell in this example) and turn off (or keep off) transistor T2 of memory cell 210. This allows information to be read from memory cell 210. Voltages V0 and V2 can have values, such that transistors T1 and T2 of each of memory cells 211 through 215 (unselected memory cells in this example) are turned off (e.g., kept off). Voltage V3 can have a value, such that a current (e.g., read current) may be formed on a read path that includes data lines 221 and 221' and transistor T1 of memory cell 210.

This allows a detection of current on the read path coupled to memory cell 210. A detection circuitry (not shown) of memory device 200 can operate to translate the value of detected current (during reading of information from a selected memory cell) into the value (e.g., "0", "1", or a combination of multi-bit values) of information read from the selected memory cell. In the example of FIG. 3, the value of detected current on data lines 221 and 221' can be translated into the value of information read from memory cell 210.

In the read operation shown in FIG. 3, the voltages applied to respective access lines 241, 242, and 243 can cause transistors T1 and T2 of each of memory cells 212 through 215, except transistor T1 of memory cell 210, to turn off (or to remain turned off). Transistor T1 of memory cell 210 may or may not turn on, depending on the value of the threshold voltage Vt 1 of transistor T1 of memory cell 210. For example, if transistor T1 of each of the memory cells (e.g., 210 through 215) of memory device 200 is configured (e.g., structured) such that the threshold voltage of transistor T1 is less than zero (e.g., Vt1<0V) regardless of the value (e.g., the state) of information stored in a respective memory cell 210, then transistor T1 of memory cell 210, in this example, can turn on and conduct a current between data lines 221 and 221' (through transistor T1 of memory cell 210). Memory device 200 can determine the value of information stored in memory cell 210 based on the value of the current between read data lines 221 and 221'. As described above, memory device 200 can include detection circuitry to measure the value of current between data lines 221 and 221' (or between data lines 222 and 222) during a read operation.

Figure 4:
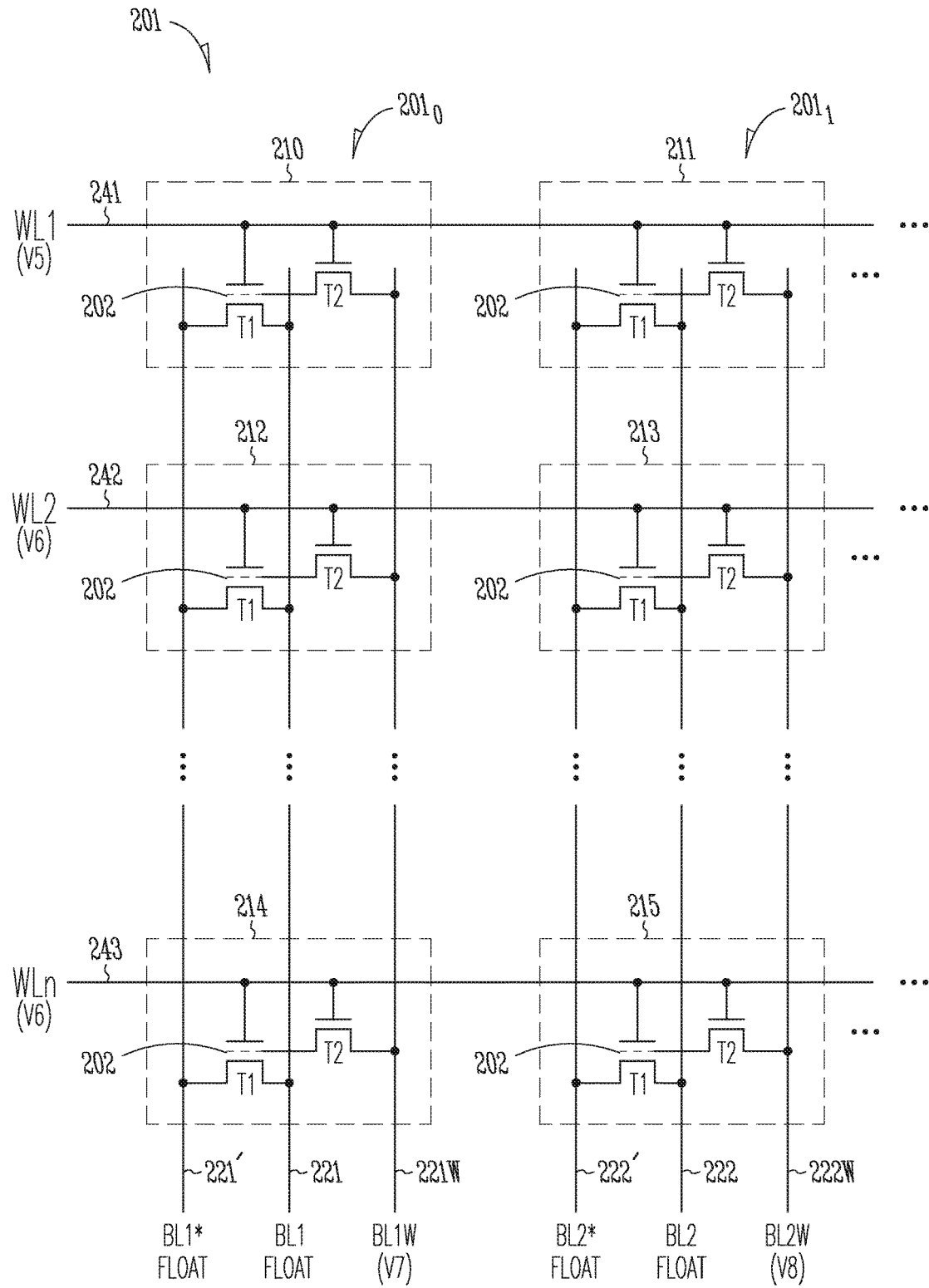
FIG. 4 shows the memory device of FIG. 2, including example voltages used during a write operation of the memory device, according to some embodiments described herein.

FIG. 4 shows memory device 200 of FIG. 2 including example voltages V5. V6, V7, and V8 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information stored is not to be stored in memory cells 212 through 215 while information is stored in memory cells 210 and 211 in the example of FIG. 4.

In FIG. 4, voltages V5, V6, V7, and V8 can represent different voltages applied to respective access lines 241, 242, and 243, and data lines 221W and 222W during a write operation of memory device 200. As an example, voltages V5 and V6 can have values of 2.5V and 0V, respectively. The value of each of voltages V7 and V8 can be less than, equal to, or greater than the value of voltage V5, depending on the value (e.g., "0" or "1") of information to be stored in memory cells 210 and 211. The specific values of voltages used in this description are only example values. Different values may be used.

The values of voltages V7 and V8 can be the same or different, depending on the value (e.g., "0" or "1") of information to be stored in memory cells 210 and 211. For example, the values of voltages V7 and V8 can be the same (e.g., V7=V8) if the memory cells 210 and 211 are to store information having the same value. As an example, V7=V8=0V, and V5=2.5V if information to be stored in each memory cell 210 and 211 is "0", and V7=V8=1V to 3V, and V5=2.5V if information to be stored in each memory cell 210 and 211 is "1".

In another example, the values of voltages V7 and V8 can be different (e.g., V7≠V8) if the memory cells 210 and 211 are to store information having different values. As an example, V7=0V, V8=1V to 3V, and V5=2.5V if "0" is to be stored in memory cell 210 and "1" is to be stored in memory cell 211). As another example, V7=1V to 3V, V8=0V, and V5=2.5V if "1" is to be stored in memory cell 210 and "0" is to be stored in memory cell 211).

The range of voltage of 1V to 3V is used here as an example. A different range of voltage can be used. Further, instead of applying 0V (e.g., V7=0V or V8=0V) to a particular write data line (e.g., data line 221W or 222W) for storing information having a value of "0" to the memory cell (e.g., memory cell 210 or 211) coupled to that particular write data line, a positive voltage (e.g., V7>0V or V8>0V) may be applied to that particular data line.

In a write operation of memory device 200 of FIG. 4, voltage V6 can have a value, such that transistors T1 and T2 of each of memory cells 212 through 215 (unselected memory cells in this example) are turned off (e.g., kept off). Voltage V5 can have a value to turn on transistor T2 of each of memory cells 210 and 211 (selected memory cells in this example) and form a write path between charge storage structure 202 of memory cell 210 and data line 221W, and a write path between charge storage structure 202 of memory cell 211 and data line 222W. A current (e.g., write current) may be formed between charge storage structure 202 of memory cell 210 and data line 221W. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 and data line 222W. This current can affect (e.g., change) the amount of charge on charge storage structure 202 of memory cell 211 to reflect the value of information to be stored in memory cell 211.

In the example write operation of FIG. 4, the value of voltage V7 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V8, in this example, may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

The example write operation of FIG. 4 assumes that memory cells 210 and 211 are selected (e.g., concurrently selected) to store (e.g., concurrently store) information. In another write operation, either memory cell 210 or memory cell 211 can be selected to store information. For example, in another write operation, memory cell 210 can be selected and memory cells 211 through 215 can be unselected memory cells. In such a write operation, voltage V8 can be applied with a voltage (e.g., a write inhibit voltage (e.g., V8=V5)) such that memory cell 211 is inhibited from storing information when information is stored in memory cell 210 (selected memory cell). Similarly, if memory cell 211 is selected to store information and memory cell 210 and 212 through 215 are unselected memory, then voltage V7 can be applied with a voltage (e.g., a write inhibit voltage (e.g., V7=V5)) such that memory cell 210 is inhibited from storing information when information is stored in memory cell 211 (selected memory cell).

Figure 5:
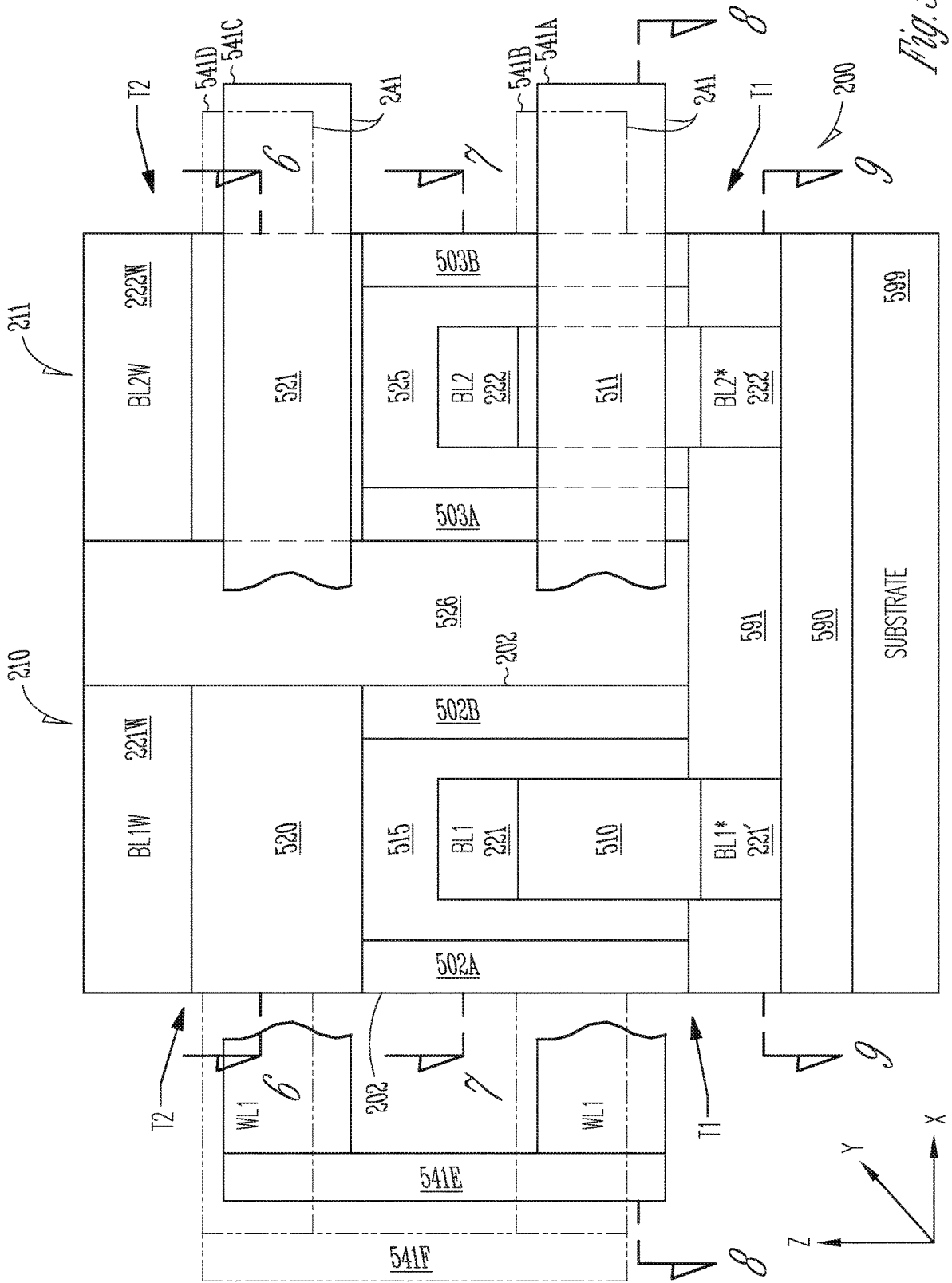
FIG. 5 through FIG. 10 show different views of a structure of the memory device of FIG. 2, according to some embodiments described herein.
Figure 6:
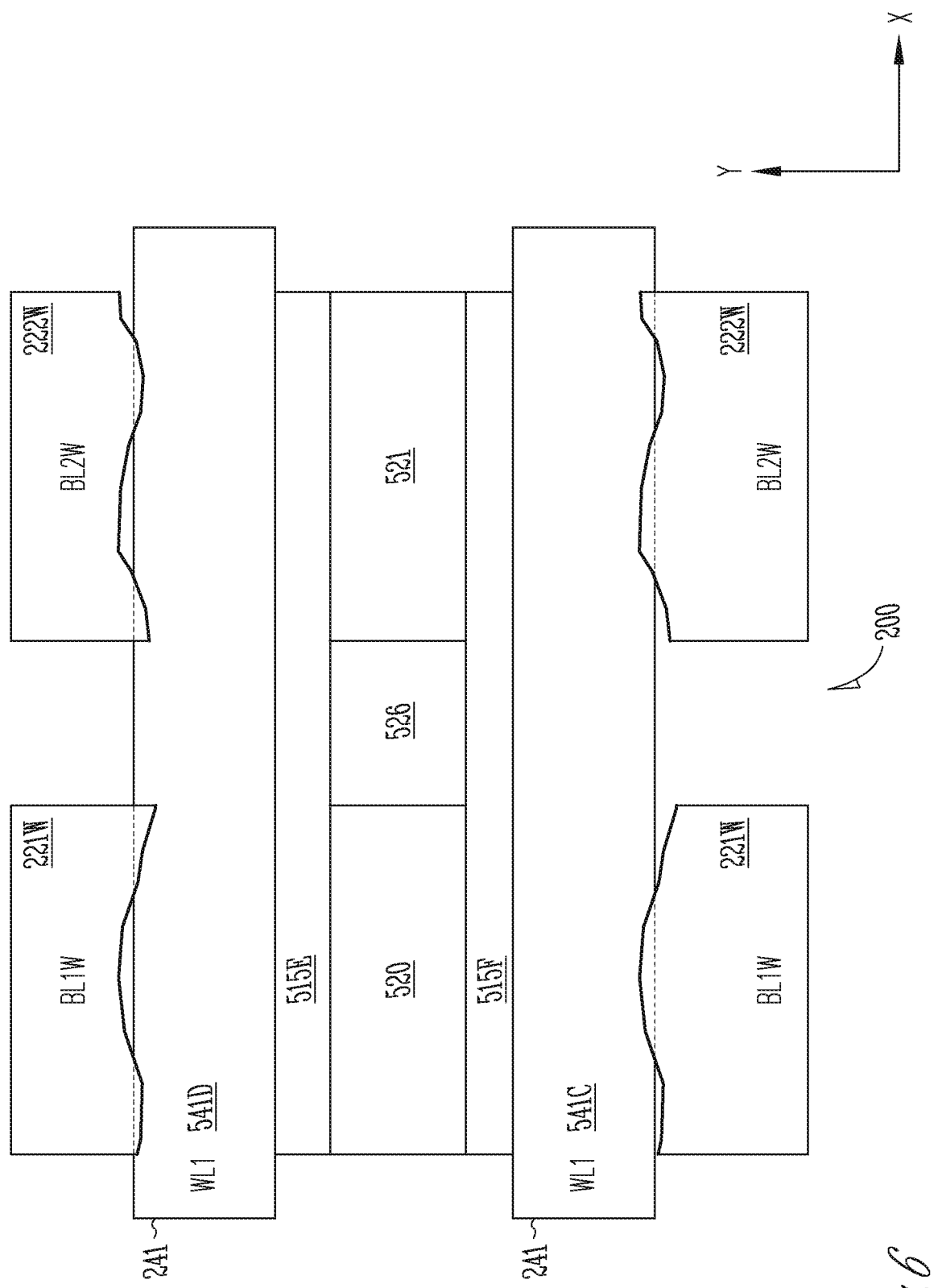
Figure 7:
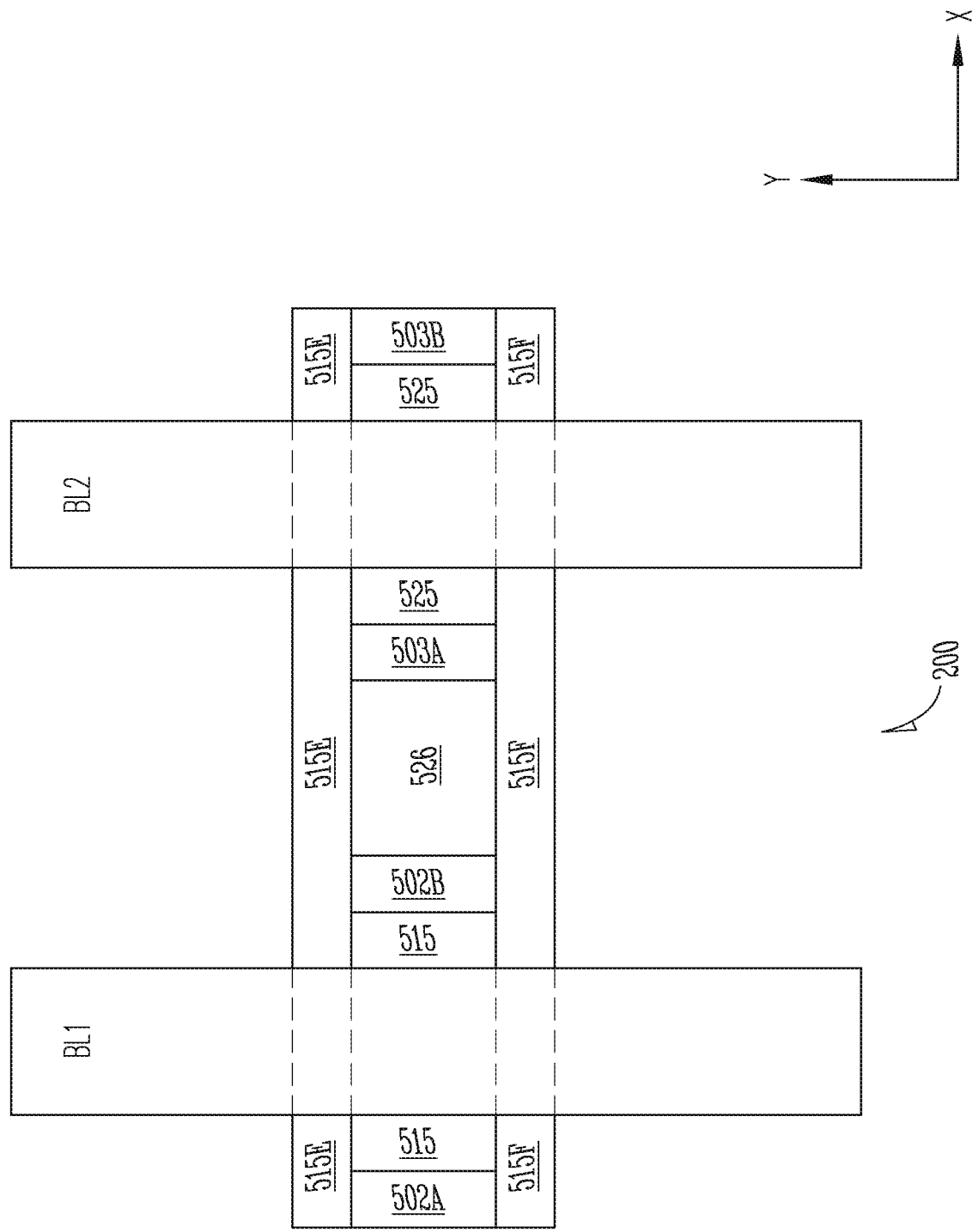
Figure 8:
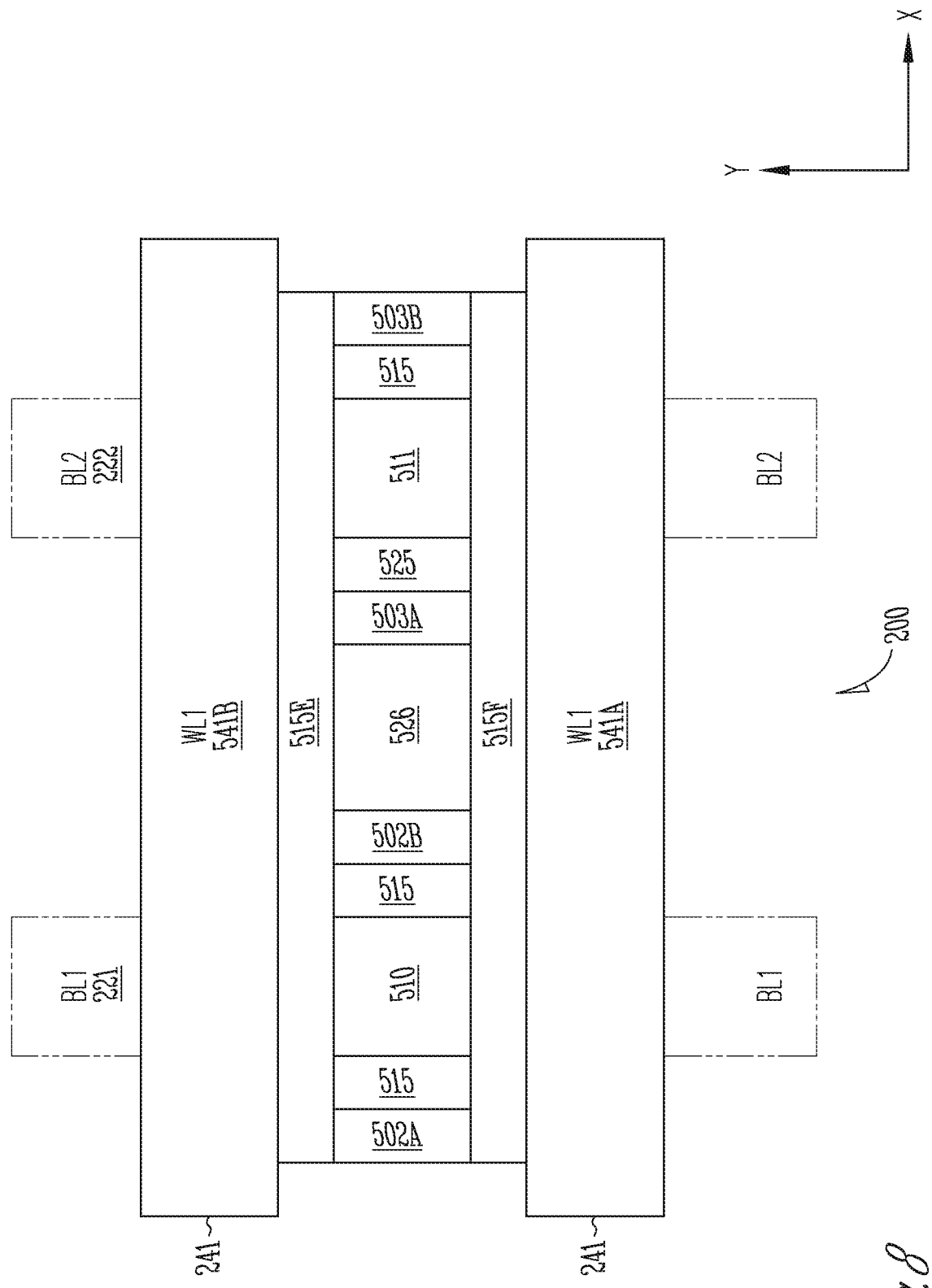
Figure 9:
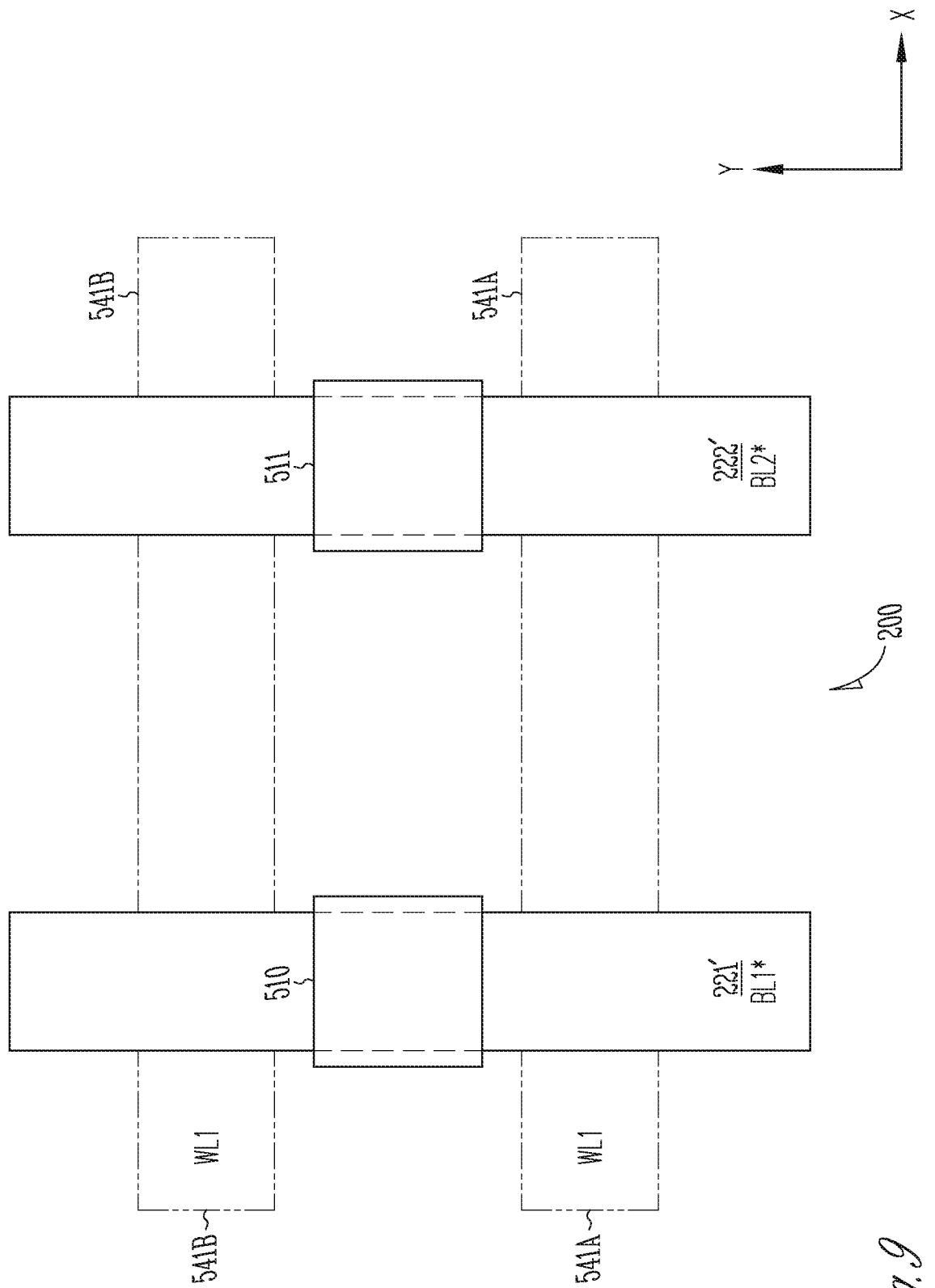
Figure 10:
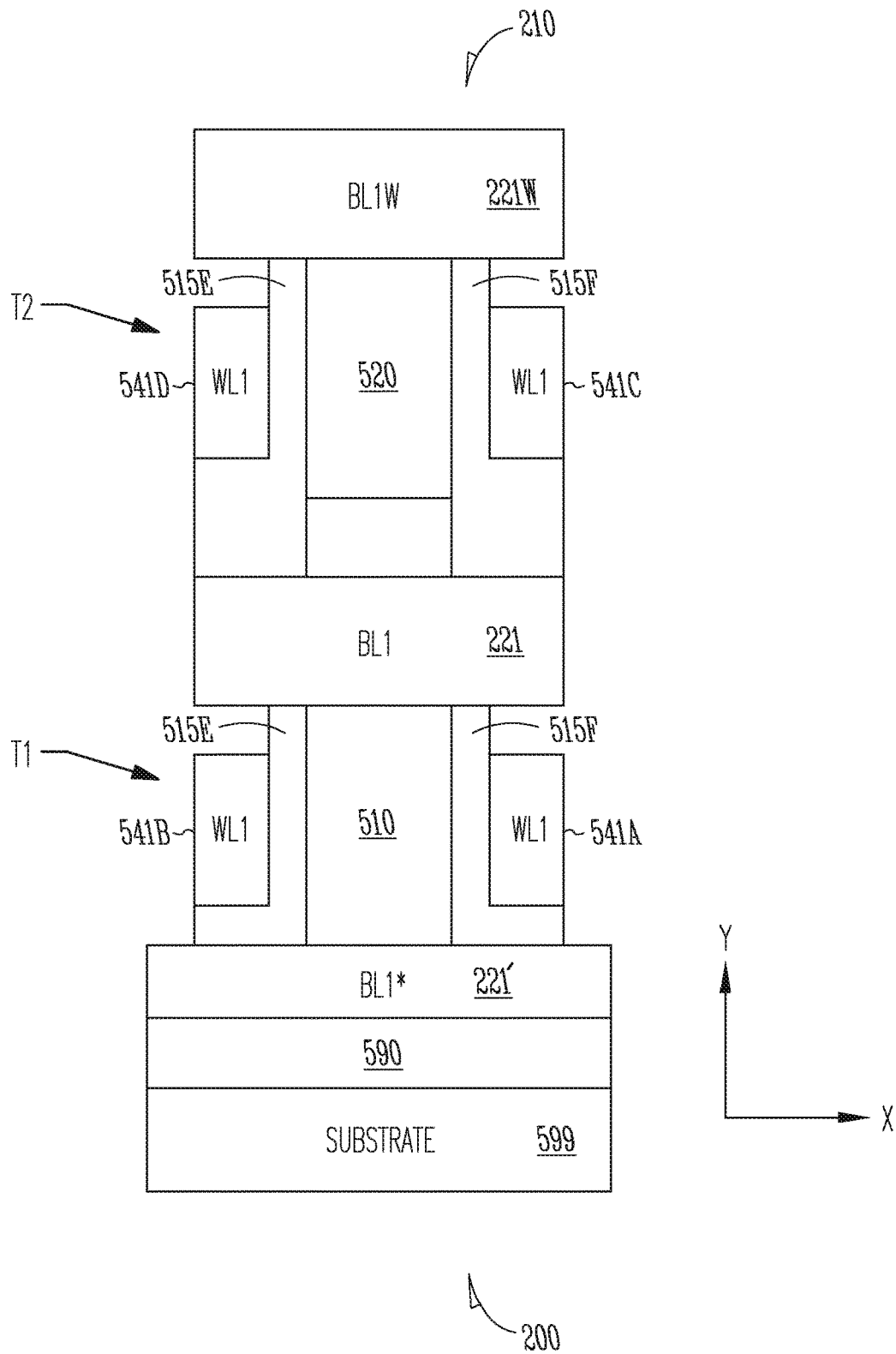

FIG. 5 through FIG. 10 show different views of a structure of memory device 200 of FIG. 2 with respect to the X, Y, and Z directions, according to some embodiments described herein. FIG. 5 shows a side view of memory device 200 with respect to the X-Z directions. FIG. 6. FIG. 7, FIG. 8. FIG. 9, and FIG. 10 show views taken along lines 6-6, 7-7, 8-8, 9-9, and 10-10, respectively, of FIG. 5.

For simplicity, FIG. 5 through FIG. 10 focus on the structure of memory cells 210 and 211. The structures of other memory cells (e.g., memory cells 212, 213, 214, and 215) of memory device 200 of FIG. 2 can be similar to or identical to the structures of memory cells 210 and 211 shown in FIG. 5. In FIG. 5 through FIG. 10 (which shows the physical structure of memory device 200) and FIG. 2 (which shows memory device 200 in circuit schematic form), the same elements are given the same reference numbers.

The following description refers to FIG. 5 through FIG. 10. For simplicity, detailed description of the same element is not repeated in the description of FIG. 5 through FIG. 10. Also for simplicity, cross-sectional lines (e.g., hatch lines) are omitted from the elements shown in FIG. 5 through FIG. 10. Some elements of memory device 200 may be omitted from a particular figure of the drawings so as to not obscure the description of the element being described in that particular figure. The dimensions of the elements shown in FIG. 5 through FIG. 10 are not scaled.

As shown in FIG. 5, memory device 200 can include a substrate 599 over which memory cells 210 and 211 can be formed (e.g., formed vertically with respect to substrate 599). Substrate 599 can be a semiconductor substrate (e.g., silicon-based substrate) or other types of substrates. The Z-direction can be a direction perpendicular to substrate 599 (e.g., a vertical direction relative to substrate 599). The X-direction and the Y-direction are perpendicular to each other and perpendicular to the Z-direction.

As shown in FIG. 5, memory device 200 can include a dielectric 526 to electrically separate memory cells 210 and 211 from each other. Dielectric 526 can include silicon dioxide.

Each of data lines 221, 221', 221W, 222, 222', and 222W (associated with signals BL1, BL1*, BLW, BL2, BL2*, BL2W, respectively) can have a length in the Y-direction, a width in the X-direction, and a thickness in the Z-direction. Each of data lines 221, 221', 221W, 222, 222', and 222W can include a conductive material (or a combination of materials) that can be structured as a conductive line (e.g., conductive region). Example materials for data lines 221, 221', 221W. 222, 222', and 222W includes metal, conductively doped polysilicon, or other conductive materials.

As shown in FIG. 5, data lines 221, 221', and 221W can include respective conductive regions located in different levels (with respect to the Z-direction) of memory device 200 and electrically separated from each other. For example, data line 221' can include a conductive region (part of the conductive material that forms data line 221') located in a level over substrate 599. Data line 221 can include a conductive region (part of the conductive material that forms data line 221) located in a level over the conductive region of data line 221'. Data line 221W can include a conductive region (part of the conductive material that forms data line 221W) located in a level over the conductive region of data line 221.

Similarly, data lines 222, 222', and 222W can include respective conductive regions located in different levels (with respect to the Z-direction) of memory device 200 and electrically separated from each other. For example, data line 222' can include a conductive region (part of the conductive material that forms data line 222') located in a level (which is the same level as data line 221') over substrate 599. Data line 222 can include a conductive region (part of the conductive material that forms data line 222) located in a level (which is the same level as data line 221) over the conductive region of data line 222'. Data line 222W can include a conductive region (part of the conductive material that forms data line 222W) located in a level (which is the same level as data line 221W) over the conductive region of data line 222.

Access line 241 (associated with signal WL1) can be structured by (can include) a combination of portions 541A. 541B, 541C, and 541D. Each of portions 541A, 541B, 541C, and 541D can include a conductive material (or a combination of materials) that can be structured as a conductive line (e.g., conductive region) having a length extending continuously in the X-direction. In FIG. 5, portions 541A, 541B. 541C, and 541D are partially shown to avoid obstructing some parts of the other the elements of memory device 200.

Each of portions 541A, 541B, 541C, and 541D can include a piece (e.g., a layer) of conductive material (e.g., metal conductively doped polysilicon, or other conductive materials). Each of portions 541A, 541B, 541C, and 541D can have a length (shown in FIG. 5) extending continuously in the X-direction, a width (shown in FIG. 5) in the Z-direction, and a thickness (shown in FIG. 6 and FIG. 8) in the Y-direction.

Portions 541A, 541B, 541C, and 541D can be electrically coupled to each other. For example, as shown in FIG. 5, access line 241 can include a portion 541E that can electrically couple portion 541A to portion 541B, and a portion 541F that can electrically couple portion 541C to portion 541D.

Portions 541A through 541F can also be electrically coupled to each other. For example, memory device 200 can include a conductive material (e.g., not shown) that can electrically couple portion 541E to portion 541F, such that portion 541A through 541F are electrically shorted to each other and the same (e.g., signal WL1) can be concurrently applied to portions 541A through 541F In an alternative structure of memory device 200, either a combination of portions 541A, 541C, and 541E or a combination of portions 541B, 541D, and 541F can be omitted, such that access line 241 can include only either a combination of portions 541A, 541C, and 541E or a combination of portions 541B, 541D, and 541F.

As shown in FIG. 5, memory device 200 can include a dielectric 590 formed over a portion of substrate 599, and a dielectric 591 formed over dielectric 590. Each of dielectrics 590 and 591 can include silicon oxide. Dielectric 590 can electrically separate data lines 221' and 222' from substrate 599. FIG. 5 shows dielectric 590 and 591 as separate dielectrics. However, dielectrics 590 and 591 can be the same dielectric (e.g., a single dielectric).

Memory device 200 can include portions 502A and 502B. Each of portions 502A and 502B can include a piece (e.g., a layer) of semiconductor material (e.g., doped or undoped polysilicon), a piece (e.g., a layer) of metal, or a piece of material (or materials) that can trap charge. As described above with reference to FIG. 2, each of memory cells 210 through 215 can include charge storage structure 202, which can form a memory element of a respective memory cell. In FIG. 5, portions 502A and 502B are part of charge storage structure 202 (FIG. 2) of memory cell 210. Thus, portions 502A and 502B are part of a memory element of memory cell 210. Similarly, memory device 200 can include portions 503A and 503B that are part of the memory element of memory cell 211.

FIG. 5 shows an example where each of portions 502A, 502B, 503A, and 503B (e.g., the bottom edge of each of portions 502A, 502B, 503A, and 503B) contacts dielectric 591 (e.g., extends to and touch the top surface of dielectric 591). However, in an alternative structure, each of portions 502A, 502B. 503A, and 503B (e.g., the bottom edge of each of portions 502A, 502B, 503A, and 503B) may not contact dielectric 591 (e.g., may not touch the top surface of dielectric 591). In such an alternative structure, each of portions 502A. 502B, 503A, and 503B (e.g., the bottom edge of each of portions 502A. 502B, 503A, and 503B) can be separated from dielectric 591 (e.g., separated from the surface of dielectric 591) by an additional dielectric (e.g., the additional dielectric can be between the bottom edge of each of portions 502A, 502B, 503A, and 503B and the top surface of dielectric 591).

FIG. 5 shows an example where the bottom edge of each of portions 502A, 502B. 503A, and 503B is at a specific distance (e.g., distance shown in FIG. 5) from the top edge of each of portions 541A and 541B. However, the distance between the bottom edge of each of portions 502A, 502B, 503A, and 503B and the top edge of each of portions 541A and 541B may vary.

Memory device 200 can include material 520 that is electrically coupled to (e.g., directly coupled to (contacting)) data line 221W and electrically coupled to (e.g., directly coupled to) portions 502A and 502B (which form charge storage structure 202 of memory cell 210). Material 520 can form a source (e.g., source terminal), a drain (e.g., drain terminal), and a channel region (e.g., write channel region) between the source and the drain of transistor T2 of memory cell 210. Thus, as shown in FIG. 5, the source, channel region, and the drain of transistor T2 of memory cell 210 can be formed from a single piece (e.g., a single layer) of the same material (or alternatively a single piece of the same combination of materials) such as material 520. Therefore, the source, the drain, and the channel of transistor T2 of memory cell 210 can be formed from the same material (e.g., material 520) of the same conductivity type (e.g., either n-type or p-type).

Memory device 200 can include material 521 that is electrically coupled to (e.g., directly coupled to (contacting)) data line 222W and electrically coupled to (e.g., directly coupled to) portions 503A and 503B (which form charge storage structure 202 of memory cell 210). Material 521 can form a source (e.g., source terminal), a drain (e.g., drain terminal), a channel region (e.g., write channel region) between the source and the drain of transistor T2 of memory cell 211. Thus, as shown in FIG. 5, the source, channel region, and the drain of transistor T2 of memory cell 211 can be formed from a single piece (e.g., a single layer) of the same material (or alternatively a single piece of the same combination of materials) such as material 521.

Materials 520 and 521 can be the same. For example, each of materials 520 and 521 can include a piece (e.g., a layer) of semiconductor material. The piece of semiconductor material can include a piece of oxide material. Examples of the oxide material used for materials 520 and 521 include semiconducting oxide materials, transparent conductive oxide materials, and other oxide materials.

As an example, each of materials 520 and 521 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide ($TiO_x$), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), and indium gallium silicon oxide (InGaSiO), and gallium phosphide (GaP).

Using the material listed above in memory device 200 provides improvements and benefits for memory device 200. For example, during a read operation to read information from a selected memory cell (e.g., memory cell 210 or 211), charge from charge storage structure 202 of the selected memory cell may leak to transistor T2 of the selected memory cell. Using the material listed above for the channel region (which is formed from material 520 or 521) of transistor T2 can reduce or prevent such a leakage. This improves accuracy of information read from the selected memory cell and improves the retention of information stored in the memory cells of the memory device (e.g., memory device 200) described herein.

The materials listed above are examples for materials 520 and 521. However, other materials (e.g., a relatively high band-gap materials) different from the above-listed materials can be used.

In FIG. 5, material 520 and charge storage structure 202 (which include portions 502A and 502B) of memory cell 210 and material 520 can be electrically coupled (e.g., directly coupled) to each other, such that material 520 can contact charge storage structure 202 of memory cell 210 without an intermediate material between charge storage structure 202 of memory cell 210 and material 520. In another example, material 520 can be electrically coupled to charge storage structure 202 of memory cell 210, such that material 520 is not directly coupled to (not contacting) charge storage structure 202 of memory cell 210, but material 520 is coupled to (e.g., indirectly contacting) charge storage structure 202 of memory cell 210 through an intermediate material (e.g., a conductive material, not shown in FIG. 5) between charge storage structure 202 of memory cell 210 and material 520.

As shown in FIG. 5, memory cell 210 can include a portion 510 electrically coupled to data lines 221 and 221'. Portion 510 can include a piece (e.g., a layer) of semiconductor material or a piece (e.g., a layer) of metal. Example semiconductor materials for portion 510 include polysilicon (e.g., undoped or doped polysilicon), germanium, silicon-germanium, or other semiconductor materials.

As described above with reference to FIG. 2, transistor T1 of memory cell 210 includes a channel region (e.g., read channel region) that can be part of a read path of memory cell 210. In FIG. 5, portion 510 can be a channel region of transistor T1 of memory cell 210. Thus, portion 510 that can be part of the read path of memory cell 210 and can carry a current (e.g., read current) during a read operation of reading information from memory cell 210. For example, during a read operation to read information from memory cell 210, portion 510 can conduct a current (e.g., read current) between data lines 221 and 221'.

Memory cell 210 can include a dielectric (e.g., silicon dioxide materials) 515 that electrically separates material 520 from data line 221 and portion 510. As shown in FIG. 5, portion 502A is adjacent to and electrically separated from a side (e.g., left side in the X-direction in the view of FIG.

5) of portion 510 by part of dielectric 515. Portion 502B is adjacent to and electrically separated from another side (e.g., right side in the X-direction in the view if FIG. 5) of portion 510 by another part of dielectric 515.

As shown in FIG. 5, part of portion 541A can span across part of (e.g., front side in the Y-direction) portion 510 (part of read channel region of transistor T1 of memory cell 210). Part of portion 541B can span across part of (e.g., back side (opposite from the front side) in the Y-direction) portion 510. Part of portion 541A can also span across part of (e.g., front side in the Y-direction) portion 511 (part of read channel region of transistor T1 of memory cell 211). Part of portion 541B can also span across part of (e.g., back side (opposite from the front side) in the Y-direction) portion 511.

Part of portion 541C can span across part of (e.g., front side in the Y-direction) material 520 (part of wire channel region of transistor T2 of memory cell 210). Part of portion 541D can span across part of (e.g., back side (opposite from the front side) in the Y-direction) material 520. Part of portion 541A can also span across part of (e.g., front side in the Y-direction) material (part of write channel region of transistor T2 of memory cell 211). Part of portion 541D can also span across part of (e.g., back side (opposite from the front side) in the Y-direction) material 521.

As shown in FIG. 6 through FIG. 10, memory device 200 can include dielectrics 515E and 515F (e.g., gate oxide regions) to electrically separate portions 541A through 541D (in the Y-direction) of access line 241 from other elements of memory cells 210 and 211.

As shown in FIG. 10, portions 541A and 541B can be adjacent respective sides (e.g., left and right sides in the x-direction) of portion 510 (e.g., read channel of transistor T1) of memory cell 210, portions 541C and 541D can be adjacent respective sides (e.g., left and right sides in the x-direction) of material 520 (e.g., write channel of transistor T2) of memory cell 210. For example, portion 541A can be adjacent a side (e.g., right side in the X-direction in the view of FIG. 10) of portion 510, and portion 541B can be adjacent another side (e.g., left side in the X-direction in the view of FIG. 10) of portion 510. In another example, portion 541C can be adjacent a side (e.g., right side in the X-direction in the view of FIG. 10) of material 520, and portion 541D can be adjacent another side (e.g., left side in the X-direction in the view of FIG. 10) of material 520.

The above description focuses on the structure of memory cell 210. Memory cell 211 can include elements structured in ways similar or identical to the elements of memory cell 210, described above. For example, as shown in FIG. 5 through FIG. 7, memory cell 211 can include charge storage structure 202, channel region (e.g., write channel region) 521, portions 511A, 511B, and 511C (e.g., read channel region), and dielectrics 525A, 525B, and 525C.

Figure 11A:
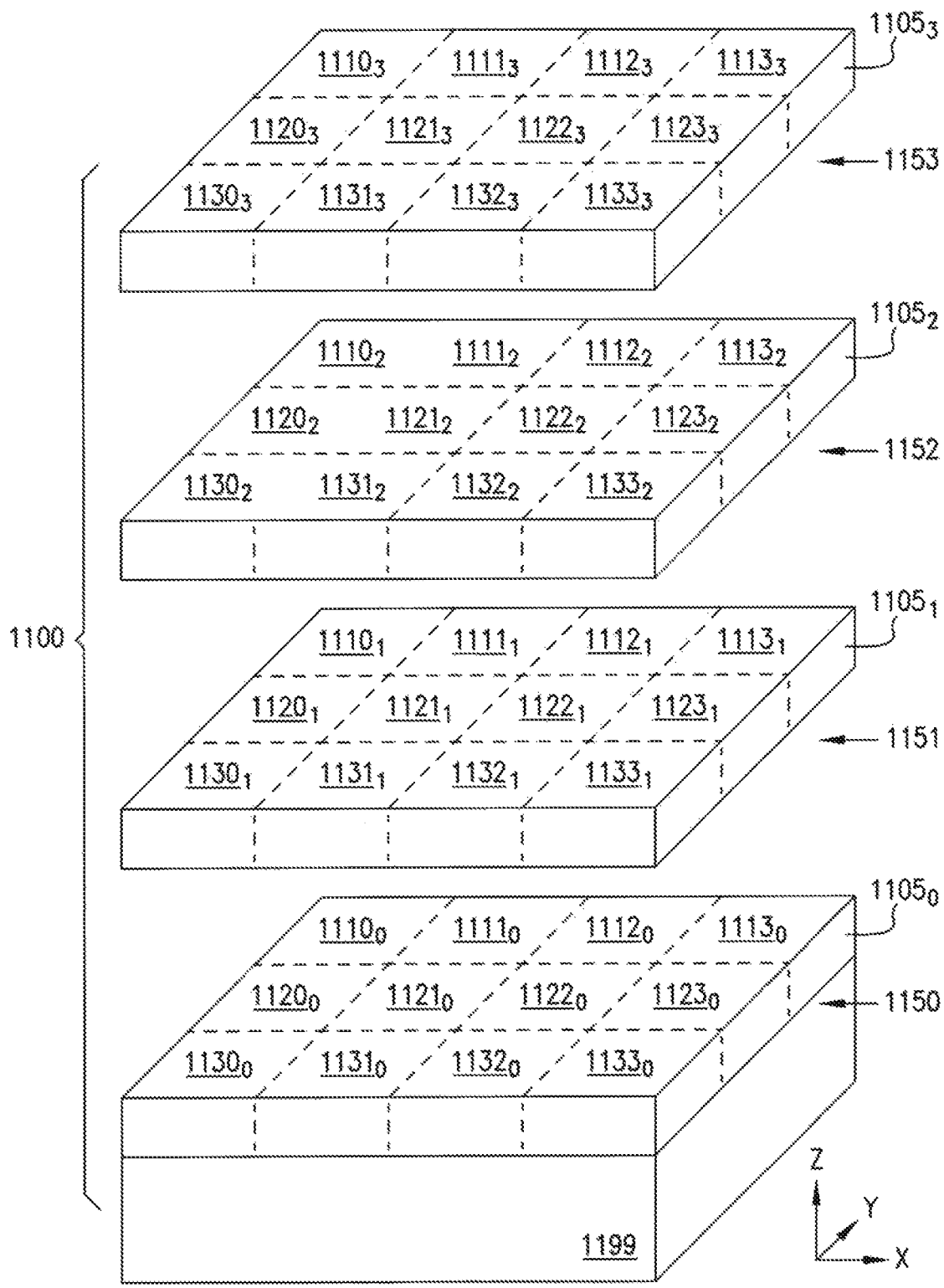
FIG. 11A, FIG. 11B, and FIG. 11C show different views of a structure of a memory device including multiple decks of memory cells, according to some embodiments described herein.
Figure 11B:
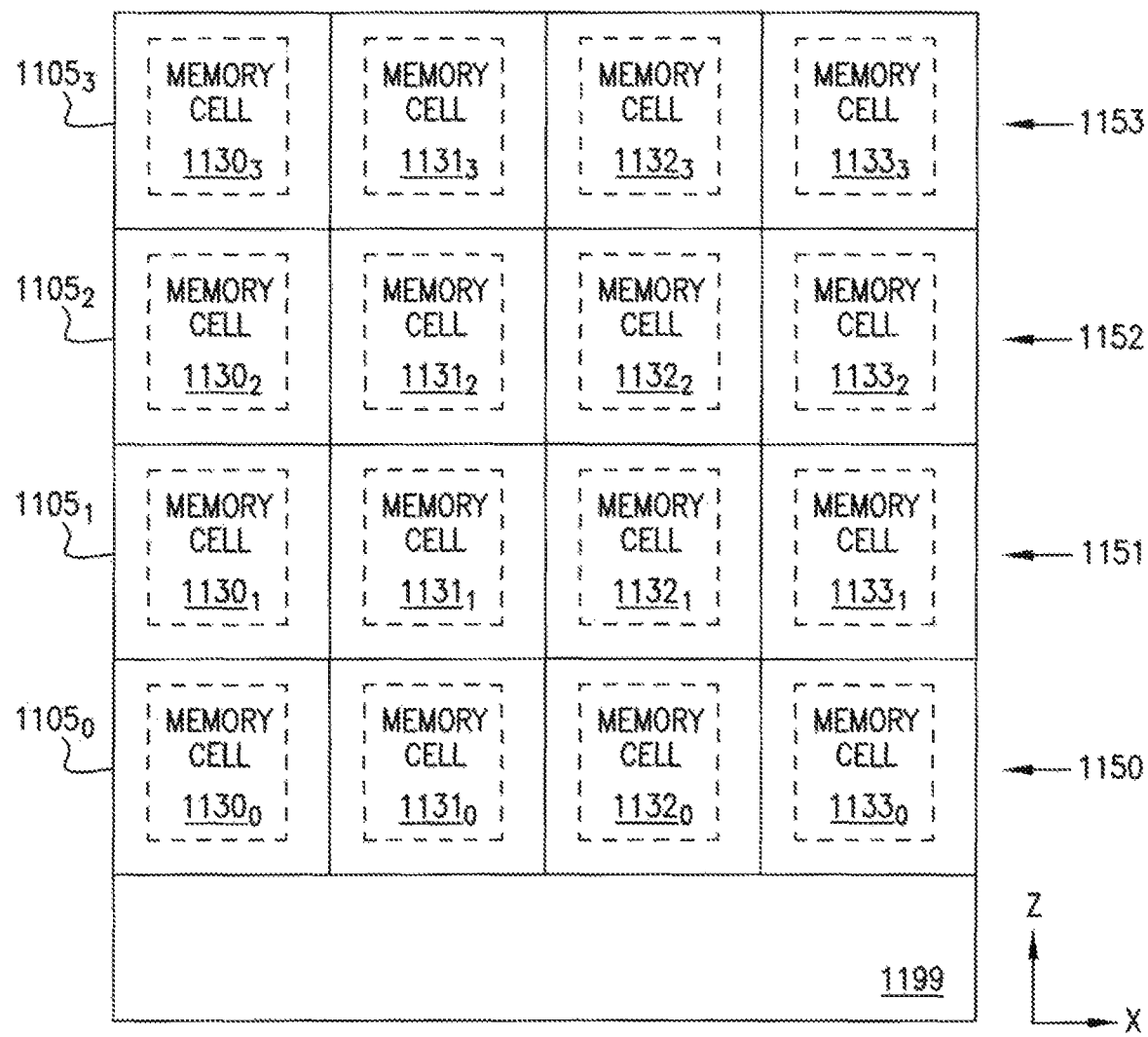
Figure 11C:
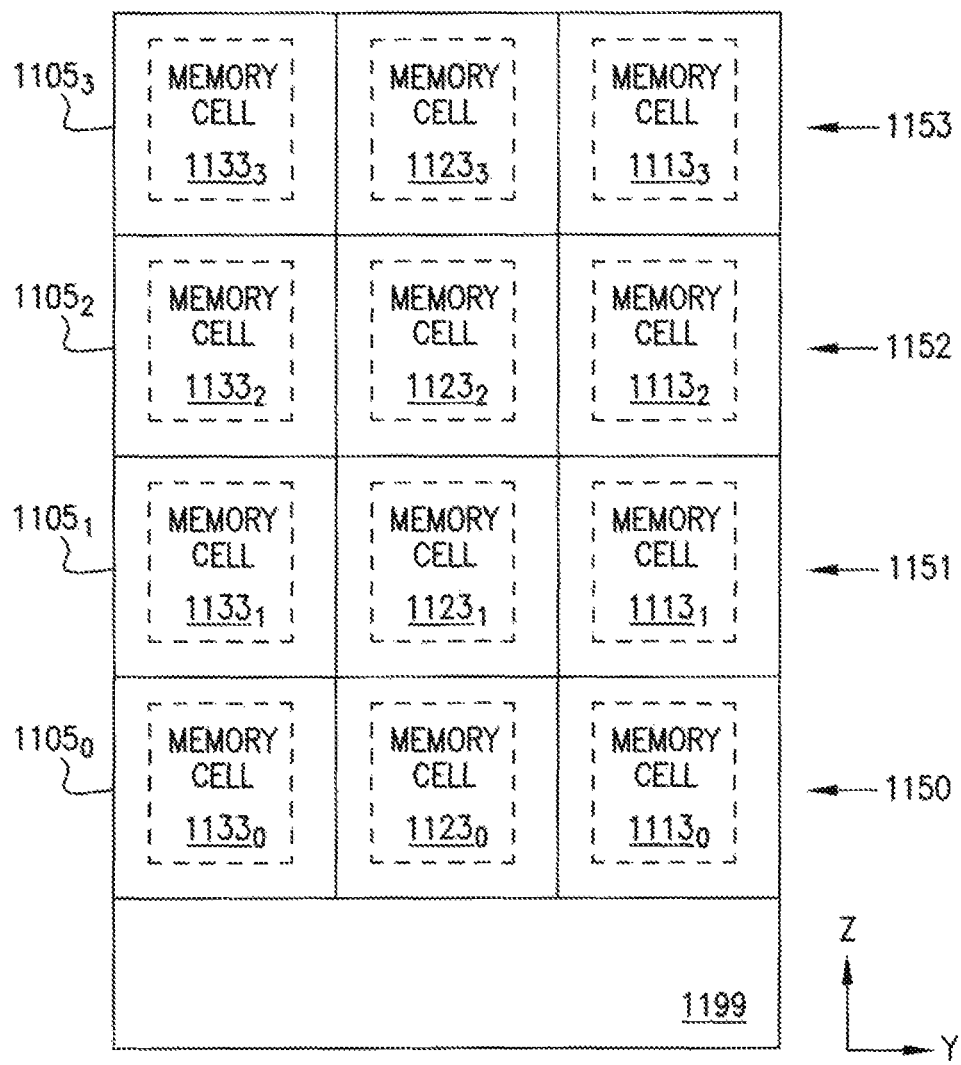

FIG. 11A, FIG. 11B, and FIG. 11C show different views of a structure of a memory device 1100 including multiple decks of memory cells, according to some embodiments described herein. FIG. 11A shows an exploded view (e.g., in the Z-direction) of memory device 1100. FIG. 11B shows a side view (e.g., cross-sectional view) in the X-direction and the Z-direction of memory device 110. FIG. 11C shows a side view (e.g., cross-sectional view) in the Y-direction and the Z-direction of memory device 1100.

As shown in FIG. 11A memory device 1100 can include decks (decks of memory cells) $1105_0$, $1105_1$, $1105_2$, and $1105_3$ that are shown separately from each other in an exploded view to help ease of viewing the deck structure of memory device 1100. In reality, decks $1105_0$, $1105_1$, $1105_2$, and $1105_3$ can be attached to each other in an arrangement where one deck can be formed (e.g., stacked) over another deck over a substrate (e.g., a semiconductor (e.g., silicon) substrate) 1199. For example, as shown in FIG. 11A, decks $1105_0$, $1105_1$, $1105_2$, and $1105_3$ can be formed in the Z-direction perpendicular to substrate 1199 (e.g., formed vertically in the Z-direction with respect to substrate 1199).

As shown in FIG. 11A, each of decks $1105_0$, $1105_1$, $1105_2$, and $1105_3$ can have memory cells arranged in the X-direction and the Y-direction (e.g., arranged in rows in the X-direction and in columns in the Y-direction). For example, deck $1105_0$ can include memory cells $1110_0$, $1111_0$, $1112_0$, and $1113_0$ (e.g., arranged in a row), memory cells $1120_0$, $1121_0$, $1122_0$, and $1123_0$ (e.g., arranged in a row), and memory cells $1130_0$, $1131_0$, $1132_0$, and $1133_0$ (e.g., arranged in a row).

Deck $1105_1$ can include memory cells $1110_1$, $1111_1$, $1112_1$, and $1113_1$ (e.g., arranged in a row), memory cells $1120_1$, $1121_1$, $1122_1$, and $1123_1$ (e.g., arranged in a row), and memory cells $1130_1$, $1131_1$, $1132_1$, and $1133_1$ (e.g., arranged in a row).

Deck $1105_2$ can include memory cells $1110_2$, $1111_2$, $1112_2$, and $1113_2$ (e.g., arranged in a row), memory cells $1120_2$, $1121_2$, $1122_2$, and $1123_2$ (e.g., arranged in a row), and memory cells $1130_2$, $1131_2$, $1132_2$, and $1133_2$ (e.g., arranged in a row).

Deck $1105_3$ can include memory cells $1110_3$, $1111_3$, $1112_3$, and $1113_3$ (e.g., arranged in a row), memory cells $1120_3$, $1121_3$, $1122_3$, and $1123_3$ (e.g., arranged in a row), and memory cells $1130_3$, $1131_3$, $1132_3$, and $1133_3$ (e.g., arranged in a row).

As shown in FIG. 11A, decks $1105_0$, $1105_1$, $1105_2$, and $1105_3$ can be located (e.g., formed vertically in the Z-direction) on levels (e.g., portions) 1150, 1151, 1152, and 1153, respectively, of memory device 1100. The arrangement of decks $1105_0$, $1105_1$, $1105_2$, and $1105_3$ forms a 3-dimensional (3-D) structure of memory cells of memory device 1100 in that different levels of the memory cells of memory device 1100 can be located (e.g., formed) in different levels (e.g., different vertical portions) 1150, 1151, 1152, and 1153 of memory device 1100.

Decks $1105_0$, $1105_1$, $1105_2$, and $1105_3$ can be formed one deck at a time. For example, decks $1105_0$, $1105_1$, $1105_2$, and $1105_3$ can be formed sequentially in the order of decks $1105_0$, $1105_1$, $1105_2$, and $1105_3$ (e.g., deck $1105_1$ is formed first and deck $1105_3$ is formed last). In this example, the memory cell of one deck (e.g., deck $1105_1$) can be formed either after formation of the memory cells of another deck (e.g., deck $1105_0$) or before formation of the memory cells of another deck (e.g., deck $1105_2$). Alternatively, decks $1105_0$, $1105_1$, $1105_2$, and $1105_3$ can be formed concurrently (e.g., simultaneously), such that the memory cells of decks $1105_0$, $1105_1$, $1105_2$, and $1105_3$ can be concurrently formed. For example, the memory cells in levels 1150, 1151, 1152, and 1153 of memory device 1100 can be concurrently formed.

The structures of the memory cells of each of decks $1105_0$, $1105_1$, $1105_2$, and $1105_3$ can include the structures of the memory cells described above with reference to FIG. 1 through FIG. 10. For example, the structures of the of the memory cells of decks $1105_0$, $1105_1$, $1105_2$, and $1105_3$ can include the structure of the memory cells of memory device 200.

Memory device 1100 can include data lines (e.g., bit lines) and access lines (e.g., word lines) to access the memory cells of decks $1105_0$, $1105_1$, $1105_2$, and $1105_3$. For simplicity, data lines and access lines of memory cells are omitted from FIG. 11A. However, the data lines and access lines of memory device 1100 can be similar to the data lines and access lines, respectively, of the memory devices described above with reference to FIG. 1 through FIG. 10.

FIG. 11A shows memory device 1100 including four decks (e.g., $1105_0$, $1105_1$, $1105_2$, and $1105_3$) as an example. However, the number of decks can be different from four. FIG. 11A shows each of decks $1105_0$, $1105_1$, $1105_2$, and $1105_3$ including one level (e.g., layer) of memory cells as an example. However, at least one of the decks (e.g., one or more of decks $1105_0$, $1105_1$, $1105_2$, and $1105_3$) can have two (or more) levels of memory cells. FIG. 11A shows an example where each of decks $1105_0$, $1105_1$, $1105_2$, and $1105_3$ includes four memory cells (e.g., in a row) in the X-direction and three memory cells (e.g., in a column) in the Y-direction. However, the number of memory cells in a row, in a column, or both, can vary.

The illustrations of apparatuses (e.g., memory devices 100, 200, and 1100) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 1100) or a system (e.g., an electronic item that can include any of memory devices 100, 200, and 1100

Any of the components described above with reference to FIG. 1 through FIG. 10 can be implemented in a number of ways, including simulation via software. Thus, apparatuses (e.g., memory devices 100, 200, and 1100) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100 and 200) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group. Audio Layer 3) players), vehicles, medical devices (e.g., heart monitor, blood pressure monitor, etc.), set top boxes, and others.

The embodiments described above with reference to FIG. 1 through FIG. 10 include apparatuses and methods of forming the apparatuses. One of the apparatuses includes a first conductive region located over a substrate, a second conductive region located over the first conductive region, a third conductive region located over the second conductive region, the first, second, and third conductive region electrically separated from each other, and a memory cell coupled to the first, second, and third regions. The memory cell includes a first material between the first and second conductive regions and electrically coupled to the first and second conductive regions, a second material located over the first conductive region and the first material, and memory element. The second material is electrically separated from the first material and electrically coupled to the third conductive region. The memory element is electrically coupled to the second material and electrically separated from the first material and first and second conductive regions. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A. B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B. and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical electrical process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first data line located over a substrate;
a second data line located over the first data line;
a third data line located over the second data line and electrically separated from the first and second data lines;
a memory cell coupled to the first, second, and third data lines, the memory cell including:
a first material between the first and second data lines and electrically coupled to the first and second data lines;

a second material located over the first data line and the first material, the second material electrically separated from the first material and electrically coupled to the third data line; and
a memory element electrically coupled to the second material and electrically separated from the first material and first and second data lines.

2. The apparatus of claim 1, wherein the first material is structured to conduct current between the first and second data lines, and the second material is structured to conduct current between the third data line and the memory element.

3. The apparatus of claim 1, wherein the second material includes a piece of semiconductor material.

4. The apparatus of claim 3, wherein the memory element includes a piece of semiconductor material contacting the second material.

5. The apparatus of claim 3, wherein the memory element includes a piece of metal contacting the second material.

6. The apparatus of claim 1, wherein the second material includes at least one of zinc tin oxide (ZTO), indium zinc oxide (IZO), zinc oxide (ZnO$_x$), indium gallium zinc oxide (IGZO), indium gallium silicon oxide (IGSO), indium oxide (InO$_x$, In$_2$O$_3$), tin oxide (SnO$_2$), titanium oxide (TiO$_x$), zinc oxide nitride (Zn$_x$O$_y$N$_z$), magnesium zinc oxide (Mg$_x$Zn$_y$O$_z$), indium zinc oxide (In$_x$Zn$_y$O$_z$), indium gallium zinc oxide (In$_x$Ga$_y$Zn$_z$O$_a$), zirconium indium zinc oxide (Zr$_x$In$_y$Zn$_z$O$_a$), hafnium indium zinc oxide (Hf$_x$In$_y$Zn$_z$O$_a$), tin indium zinc oxide (Sn$_x$In$_y$Zn$_z$O$_a$), aluminum tin indium zinc oxide (Al$_x$Sn$_y$In$_z$Zn$_a$O$_d$), silicon indium zinc oxide (Si$_x$In$_y$Zn$_z$O$_a$), zinc tin oxide (Zn$_x$Sn$_y$O$_z$), aluminum zinc tin oxide (Al$_x$Zn$_y$Sn$_z$O$_a$), gallium zinc tin oxide (Ga$_x$Zn$_y$Sn$_z$O$_a$), zirconium zinc tin oxide (Zr$_x$Zn$_y$Sn$_z$O$_a$), indium gallium silicon oxide (InGaSiO), and gallium phosphide (GaP).

7. The apparatus of claim 1, wherein the memory element includes:
a first portion electrically separated from a first side of the first material and electrically separated from a first side of the second data line; and
a second portion electrically separated from a second side of the first material and electrically separated from a second side of the second data line.

8. The apparatus of claim 7, wherein each of the first and second portions of the memory element includes a piece of semiconductor material.

9. The apparatus of claim 7, wherein each of the first and second portions of the memory element includes a piece of metal.

10. The apparatus of claim 1, further comprising:
a first conductive material including a portion adjacent a first side of the first material;
a first additional conductive material including a portion adjacent a second and first side of the first material;
a second conductive material including a portion adjacent a first side of the second material;
a second additional conductive material including a portion adjacent a second and first side of the second first material.

11. The apparatus of claim 10, wherein each of the first and second data lines has a length in a first a first direction, and each of the first conductive material, first additional conductive material, second conductive material, and second additional conductive material is part of a conductive line having a length in a second direction.

12. The apparatus of claim 11, wherein the conductive line is part of an access line of the apparatus.

13. An apparatus comprising:
a first data line;
a second data line;
a third data line; and
a memory cell coupled to the first, second, and third data lines, the memory cell including:
a first transistor including a first region contacting the first and second data lines, and a charge storage structure electrically separated from the first region; and
a second transistor including a second region electrically separated from the first region, the second region contacting the charge storage structure and contacting the third data line;
a first conductive line including a portion adjacent the first region; and
a second conductive line including a portion adjacent the second region.

14. The apparatus of claim 12, wherein the first and second conductive lines are electrically coupled to each other.

15. The apparatus of claim 12, wherein the second region includes a piece of oxide material, and the charge storage structure includes a piece of semiconductor material contacting the piece of oxide material.

16. The apparatus of claim 12, wherein the second region includes a piece of oxide material, and the charge storage structure includes a piece of metal contacting the piece of oxide material.

17. The apparatus of claim 12, wherein the first region includes a piece of semiconductor material.

18. The apparatus of claim 12, wherein the first region includes a piece of metal.

19. The apparatus of claim 12, wherein the second channel region includes at least one of zinc tin oxide (ZTO), indium zinc oxide (IZO), zinc oxide (ZnOx), indium gallium zinc oxide (IGZO), indium gallium silicon oxide (IGSO), indium oxide (InOx, In2O3), tin oxide (SnO2), titanium oxide (TiOx), zinc oxide nitride (ZnxOyNz), magnesium zinc oxide (MgxZnyOz), indium zinc oxide (InxZnyOz), indium gallium zinc oxide (InxGayZnzOa), zirconium indium zinc oxide (ZrxInyZnzOa), hafnium indium zinc oxide (HfxInyZnzOa), tin indium zinc oxide (SnxInyZnzOa), aluminum tin indium zinc oxide (AlxSnylnzZnaOd), silicon indium zinc oxide (SixInyZnzOa), zinc tin oxide (ZnxSnyOz), aluminum zinc tin oxide (AlxZnySnzOa), gallium zinc tin oxide (GaxZnySnzOa), zirconium zinc tin oxide (ZrxZnySnzOa), indium gallium silicon oxide (InGaSiO), and gallium phosphide (GaP).

* * * * *